United States Patent
Shokrollahi et al.

(10) Patent No.: US 10,573,998 B2
(45) Date of Patent: *Feb. 25, 2020

(54) SKEW-RESISTANT MULTI-WIRE CHANNEL

(71) Applicant: Kandou Labs, S.A., Lausanne (CH)

(72) Inventors: Amin Shokrollahi, Préverenges (CH); Margaret Wang Johnston, Englewood, NJ (US)

(73) Assignee: KANDOU LABS, S.A., Lausanne (CH)

(*) Notice: Subject to any disclaimer, the term of this patent is extended or adjusted under 35 U.S.C. 154(b) by 0 days.

This patent is subject to a terminal disclaimer.

(21) Appl. No.: 16/216,254

(22) Filed: Dec. 11, 2018

(65) Prior Publication Data

US 2019/0123489 A1 Apr. 25, 2019

Related U.S. Application Data

(63) Continuation of application No. 15/499,869, filed on Apr. 27, 2017, now Pat. No. 10,153,591.

(Continued)

(51) Int. Cl.

| H01R 13/6461 | (2011.01) |
|---|---|
| H01R 13/504 | (2006.01) |
| H04L 25/49 | (2006.01) |
| H01R 12/73 | (2011.01) |
| H01R 12/71 | (2011.01) |
| H01R 13/405 | (2006.01) |
| H01P 1/04 | (2006.01) |

(Continued)

(52) U.S. Cl.
CPC ....... *H01R 13/6461* (2013.01); *H01R 12/716* (2013.01); *H01R 12/73* (2013.01); *H01R 13/405* (2013.01); *H01R 13/504* (2013.01); *H04L 25/4917* (2013.01); *H01P 1/04* (2013.01); *H01P 3/00* (2013.01); *H01P 5/02* (2013.01); *H05K 1/025* (2013.01); *H05K 1/0248* (2013.01); *H05K 1/0253* (2013.01)

(58) Field of Classification Search
CPC ..... H01P 3/00; H01P 1/04; H01P 5/02; H05K 1/0248; H05K 1/025; H05K 1/0253; H01R 13/6461; H01R 12/716; H01R 13/405; H01R 13/504; H04L 25/4917
See application file for complete search history.

(56) References Cited

U.S. PATENT DOCUMENTS

| 5,334,956 A * | 8/1994 | Leding | H01B 11/1895 333/243 |
|---|---|---|---|
| 5,539,360 A * | 7/1996 | Vannatta | H01P 3/00 174/117 FF |

(Continued)

*Primary Examiner* — Janice N Tieu
(74) *Attorney, Agent, or Firm* — Invention Mine LLC

(57) ABSTRACT

Methods and systems described include a first dielectric material having a plurality of embedded conductors of a multi-wire channel, the plurality of embedded conductors comprising at least a first, second and third conductor, wherein a first distance between the first and second conductors is less than a second distance between the first and third conductors, wherein the first dielectric material has a first dielectric constant $\varepsilon_1$ and a second dielectric material embedded in the first dielectric material, the second dielectric material embedded in between the first and third conductors, the second dielectric material having a second dielectric constant $\varepsilon_2$, wherein $\varepsilon_2 > \varepsilon_1$.

20 Claims, 15 Drawing Sheets

Related U.S. Application Data

(60) Provisional application No. 62/328,735, filed on Apr. 28, 2016.

(51) Int. Cl.
*H05K 1/02* (2006.01)
*H01P 3/00* (2006.01)
*H01P 5/02* (2006.01)

(56) References Cited

U.S. PATENT DOCUMENTS

| | | |
|---|---|---|
| 5,798,563 A | 8/1998 | Feilchenfeld et al. |
| 6,242,321 B1 * | 6/2001 | Acosta ............... H01L 27/10852 |
| | | 257/E21.009 |
| 6,854,030 B2 | 2/2005 | Perino et al. |
| 7,085,336 B2 | 8/2006 | Lee et al. |
| 7,123,660 B2 | 10/2006 | Haq et al. |
| 7,145,411 B1 | 12/2006 | Blair et al. |
| 7,336,139 B2 | 2/2008 | Blair et al. |
| 7,366,942 B2 | 4/2008 | Lee |
| 8,040,200 B2 | 10/2011 | Minegishi et al. |
| 8,782,578 B2 | 7/2014 | Tell |
| 8,989,317 B1 * | 3/2015 | Holden ............... H04L 25/0272 |
| | | 375/295 |
| 9,300,503 B1 | 3/2016 | Holden et al. |
| 9,319,218 B2 | 4/2016 | Pandey et al. |
| 10,313,068 B1 | 6/2019 | Ahmed et al. |
| 2001/0055344 A1 | 12/2001 | Lee et al. |
| 2003/0046618 A1 | 3/2003 | Collins |
| 2005/0134380 A1 | 6/2005 | Nairn |
| 2006/0092969 A1 | 5/2006 | Susnow et al. |
| 2007/0103338 A1 | 5/2007 | Teo |
| 2007/0176708 A1 | 8/2007 | Otsuka et al. |
| 2008/0175586 A1 | 7/2008 | Perkins et al. |
| 2010/0153792 A1 | 6/2010 | Jang |
| 2011/0156757 A1 | 6/2011 | Hayashi |
| 2012/0020660 A1 | 1/2012 | Le et al. |
| 2012/0050079 A1 | 3/2012 | Goldman et al. |
| 2012/0125665 A1 | 5/2012 | Masuda |
| 2013/0249719 A1 | 9/2013 | Ryan |
| 2014/0112376 A1 | 4/2014 | Wang et al. |
| 2016/0134267 A1 | 5/2016 | Adachi |
| 2017/0317449 A1 | 11/2017 | Shokrollahi et al. |
| 2017/0317855 A1 | 11/2017 | Shokrollahi et al. |

* cited by examiner

SKEW-RESISTANT MULTI-WIRE CHANNEL

CROSS REFERENCE TO RELATED APPLICATIONS

This application is a continuation of U.S. application Ser. No. 15/499,869 filed Apr. 27, 2017, entitled "SKEW-RESISTANT MULTI-WIRE CHANNEL", which claims the benefit of U.S. Provisional Application No. 62/328,735, filed Apr. 28, 2016, entitled "SKEW-RESISTANT MULTI-WIRE CHANNEL", all of which are hereby incorporated by reference in their entirety for all purposes.

REFERENCES

The following prior applications are herein incorporated by reference in their entirety for all purposes:

U.S. Pat. No. 9,100,232, filed Feb. 2, 2015 and issued Aug. 4, 2015, naming Ali Hormati, Amin Shokrollahi, and Roger Ulrich, entitled "Method and Apparatus for Low Power Chip-to-Chip Communications with Constrained ISI Ratio," hereinafter [Hormati I].

U.S. Pat. No. 9,596,109, filed Apr. 15, 2014 and issued Apr. 14, 2017, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Communications Interface," hereinafter [Fox I].

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector-signaling methods have been proposed to further optimize the trade-offs between power consumption, pin efficiency and noise robustness of chip-to-chip communication systems. In those vector signaling systems, the digital information is transformed into a different representation space in the form of a vector codeword that is chosen in order to optimize the power consumption, pin-efficiency and speed trade-offs based on the transmission channel properties and communication system design constraints. Herein, this process is referred to as "encoding". At the receiver side, the received signals corresponding to the codeword are transformed back into the original digital information representation space. Herein, this process is referred to as "decoding".

BRIEF DESCRIPTION

Methods and systems are described for obtaining a set of information signals and responsively generating symbols of a multi-level vector signaling codeword, the multi-level vector signaling codeword representing a sum of a plurality of orthogonal sub-channel vectors, each sub-channel vector having an associated weight determined by a corresponding information signal, and transmitting the symbols of the codeword over a multi-wire skew-balanced channel, the multi-wire skew-balanced channel having (i) a plurality of conductors, each conductor for carrying a respective symbol of the multi-level vector signaling codeword and (ii) at least first and second dielectric materials interposed between the plurality conductors to offset coupling mismatches associated with geometric mismatches between the plurality of conductors.

In some embodiments, a multi-wire skew-balanced channel include a first dielectric material having a plurality of embedded conductors of a multi-wire channel, the plurality of embedded conductors comprising at least a first, second and third conductor, wherein a first distance between the first and second conductors is less than a second distance between the first and third conductors, wherein the first dielectric material has a first dielectric constant $\varepsilon_1$ and a second dielectric material embedded in the first dielectric material, the second dielectric material embedded in between the first and third conductors, the second dielectric material having a second dielectric constant $\varepsilon_2$, wherein $\varepsilon_2 > \varepsilon_1$.

DETAILED DESCRIPTION

Figure 1A:
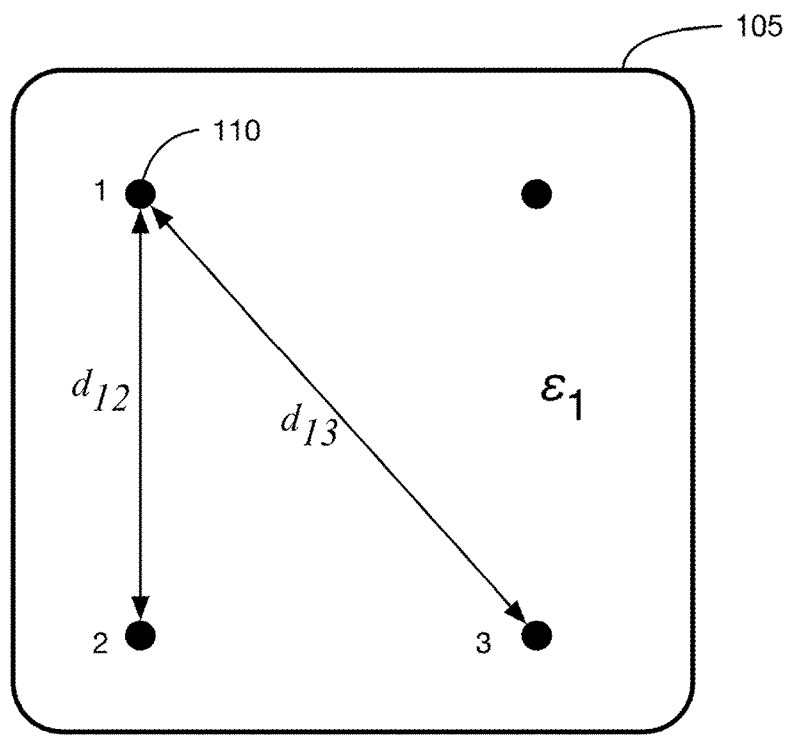
FIGS. 1A and 1B illustrate an exemplary four-wire channel.
Figure 1B:
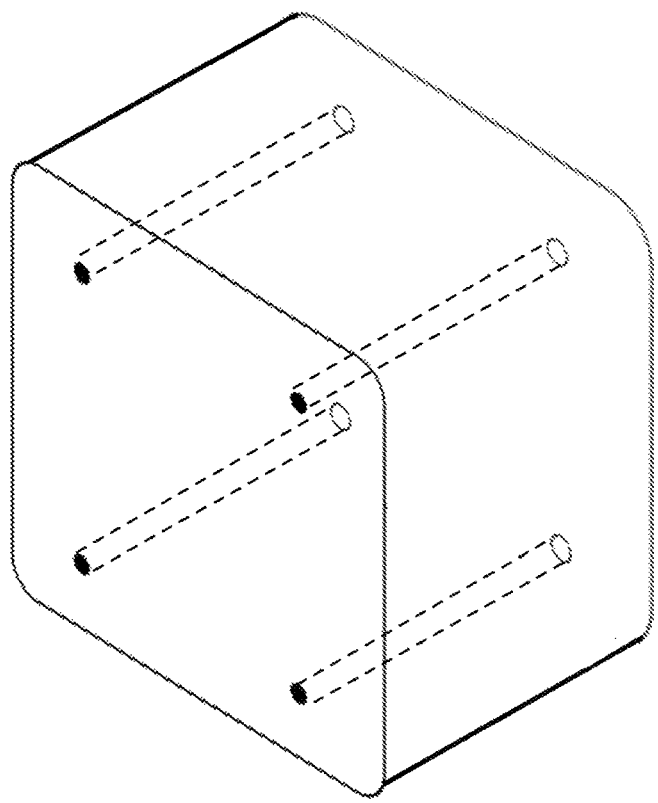

Embodiments are described herein for reducing skew in a multi-wire channel by adjusting signal propagation speed through the use of dielectric materials. In vector signaling embodiments, wire skew and a capacitive coupling mismatch for a given chord of three or more symbols may be introduced if there are varying distances between any three wires. Correcting for skew in vector signaling may improve performance as each conductor is carrying a symbol of the chord, rather than being part of a differential pair. By matching the capacitive coupling between the conductors, the skew between the symbols of the chord may be reduced, providing more accurate and reliable detection of encoded data. FIGS. 1A and 1B illustrate an exemplary four-wire channel. As shown, FIG. 1A includes a first dielectric material 105 having a dielectric constant $\varepsilon_1$, and four signal conductors 110. The signal conductors may pass through the dielectric material 105, as shown in FIG. 1B. In some embodiments, dielectric material 105 may be a cavity of air (enclosed by a plastic housing, for example), or various other gases having various possible dielectric constants $\varepsilon$. Alternatively, the dielectric material 105 may be a solid material, such as plastic, or any other dielectric materials known to those of skill in the art.

As shown in FIG. 1A, the distance between conductor 1 and adjacent conductor 2 is $d_{12}$, while the distance between conductor 1 and diagonal conductor 3 is $d_{13}$. It is evident in FIG. 1A that $d_{12}<d_{13}$. As known to those of skill in the art, the velocity factor (VF; the ratio of the speed at which a waveform passes through a medium to the speed of light in a vacuum) is inversely proportional to the square root of the dielectric constant k, as shown below in Eqn. 1:

$$VF = \frac{1}{\sqrt{k}} \quad \text{(Eqn. 1)}$$

However, it can also be shown that VF may be related to the capacitance C between conductors:

$$VF = \frac{1}{c\sqrt{LC}} \quad \text{(Eqn. 2)}$$

where L is the distributed inductance, C is the capacitance between the conductors, and c is the speed of light in a vacuum. Further, as capacitance between two conductors is inversely proportional to the distance d between them:

$$\left(C = \frac{\pi\varepsilon}{\ln\left(\frac{d}{a}\right)}\right) \quad \text{(Eqn. 3)}$$

where d is the distance between the conductors and a is the area of the of the cross-section of the conductors, then the capacitance $C_{12}$ between conductors 1 and 2 will be larger than the capacitance $C_{13}$ between conductors 1 and 3 when $d_{12}<d_{13}$. Following this observation, it can be derived that the velocity factor between conductors 1 and 2 (denoted $VF_{12}$) will be less than the $VF_{13}$ between conductors 1 and 3. Such a difference in capacitive coupling and VF may cause skew to appear at the end of the channel, and may result in the symbols of the vector signaling codeword to be received at the end of the channel at skewed times. By equalizing the capacitive coupling such that $C_{12}=C_{13}$, the skew at the end of the channel may be reduced, among other beneficial transmission characteristics.

Figure 2:
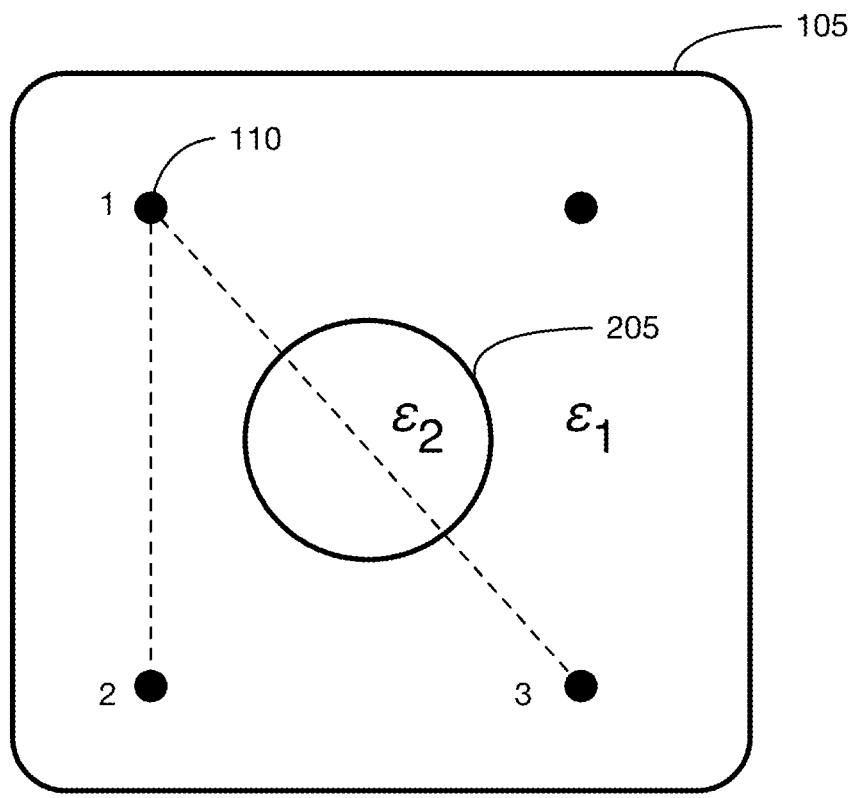
FIG. 2 illustrates an exemplary skew-resistant four-wire channel with first and second dielectric materials, in accordance with some embodiments.

In some embodiments, skew is introduced due to geometric mismatches regarding the conductors. In some embodiments, the geometric mismatches may correspond to varying distances between pairs of conductors, surface areas of the cross sections of conductors, or various other aspects regarding the design/layout of the multi-wire channel. In some embodiments, the skew introduced by such geometric mismatches may be offset by equalizing capacitive coupling between all conductors in the channel. In some embodiments, equalizing the capacitive coupling can be done by inserting a second dielectric material having a dielectric constant of $\varepsilon_2$ in between conductors 1 and 3, where $\varepsilon_2>\varepsilon_1$, which will offset the mismatch caused by the geometric (i.e., spatial distance) mismatch. By selecting a dielectric material having a dielectric constant $\varepsilon_2$, $VF_{13}$ may be reduced until $VF_{13}=VF_{12}$, according to Eqn. 1 above. Alternatively, $\varepsilon_2$ may be fixed, while the dielectric material 105 is selected to have a $\varepsilon_1$ that is less than $\varepsilon_2$, thus increasing $VF_{12}$ until it is equal to $VF_{13}$. FIG. 2 illustrates an example skew-tolerant four-wire channel, in accordance with some embodiments. As shown, FIG. 2 is similar to the four-wire channel shown in FIG. 1A, with the addition of the dielectric material 205 having dielectric constant $\varepsilon_2$ inserted into the middle of dielectric material $\varepsilon_1$. As one will observe, the dielectric constant between conductors 1 and 2 remains $\varepsilon_1$, while the effective dielectric constant between conductors 1 and 3 is a combination of $\varepsilon_1$ and $\varepsilon_2$. In some embodiments, the effective combination may be tuned (e.g., adjusting the capacitance seen between conductors) until $VF_{13}=VF_{12}$, for instance, by selecting a material having a larger or smaller relative dielectric constant $\varepsilon_2$. Alternatively, a diameter of dielectric material 205 may be adjusted in order to tune the effective combination of $\varepsilon_1$ and $\varepsilon_2$. It should be noted that although dielectric material 205 is shown as a cylinder, this should not be considered limiting, and tuning the effective combination of $\varepsilon_1$ and $\varepsilon_2$ may include adjusting other size parameters such as width or length, if a square/rectangle is used, for example.

Figure 3A:
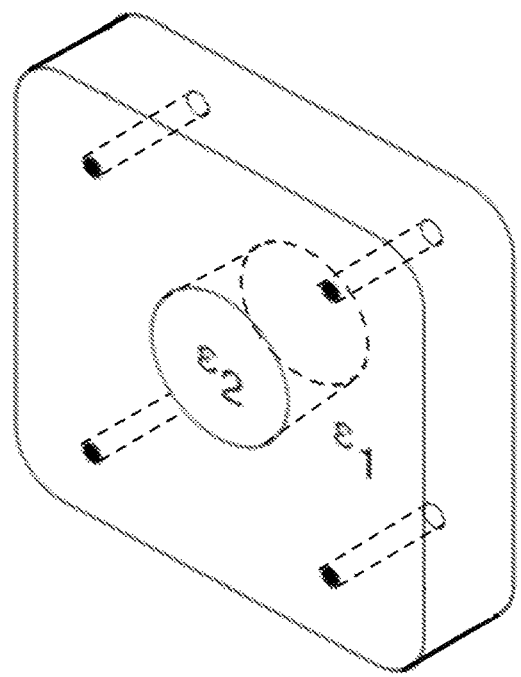
FIGS. 3A and 3B illustrate various lengths of the skew-resistant four-wire channel of FIG. 2, in accordance with some embodiments.
Figure 3B:
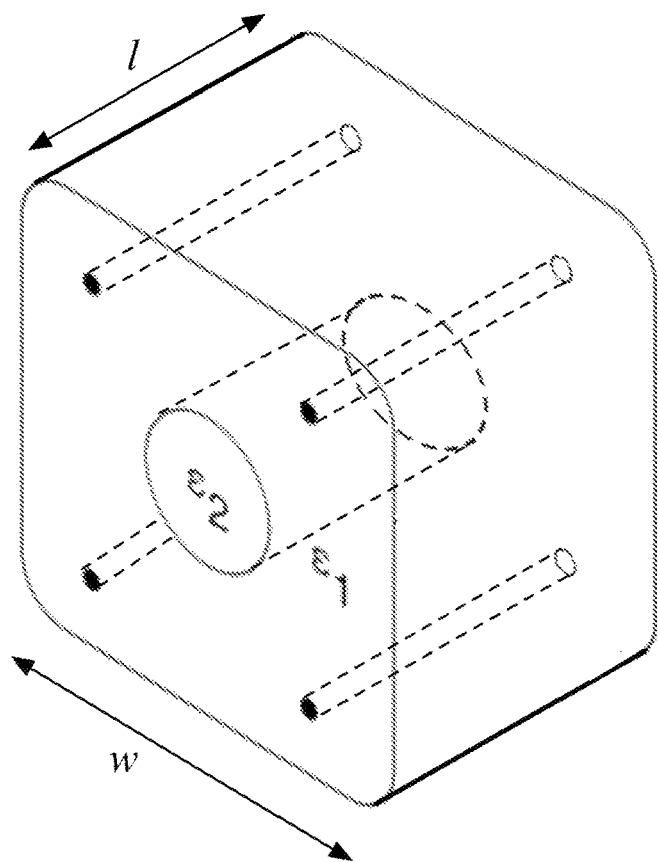
Figure 4A:
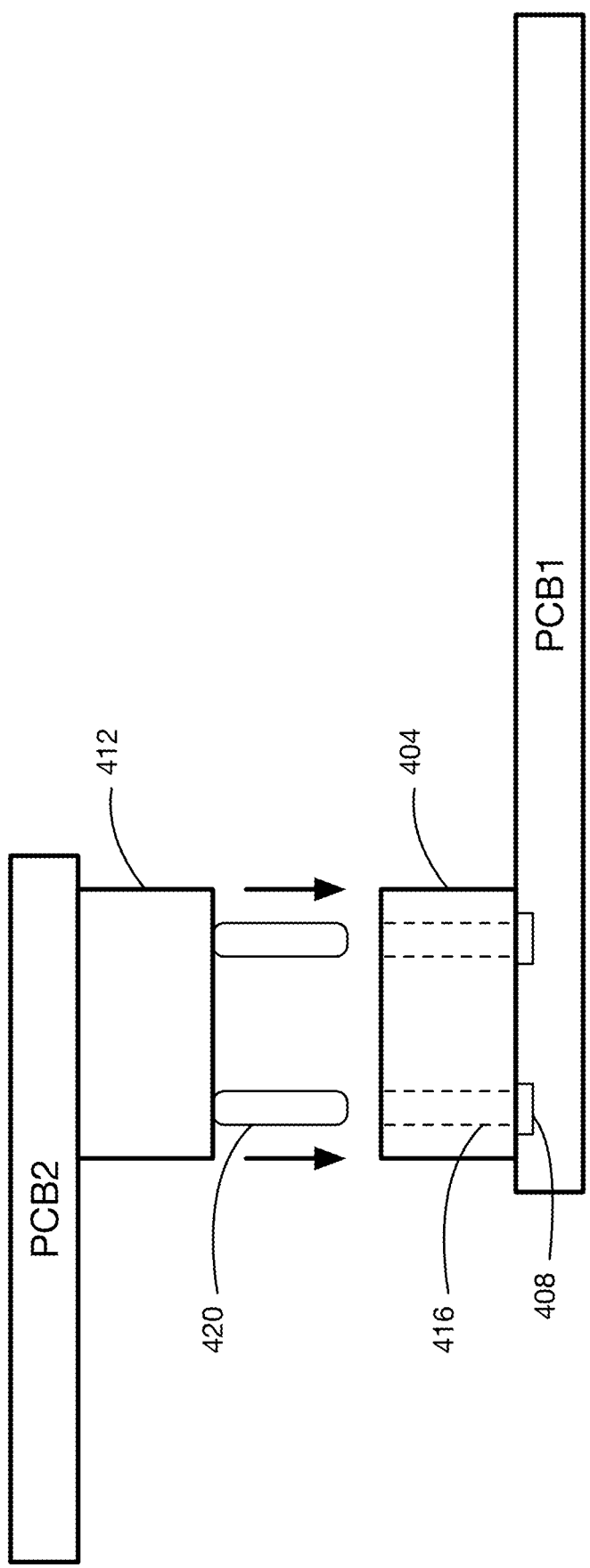
FIGS. 4A and 4B illustrate exemplary connection interfaces, in accordance with some embodiments.
Figure 4B:
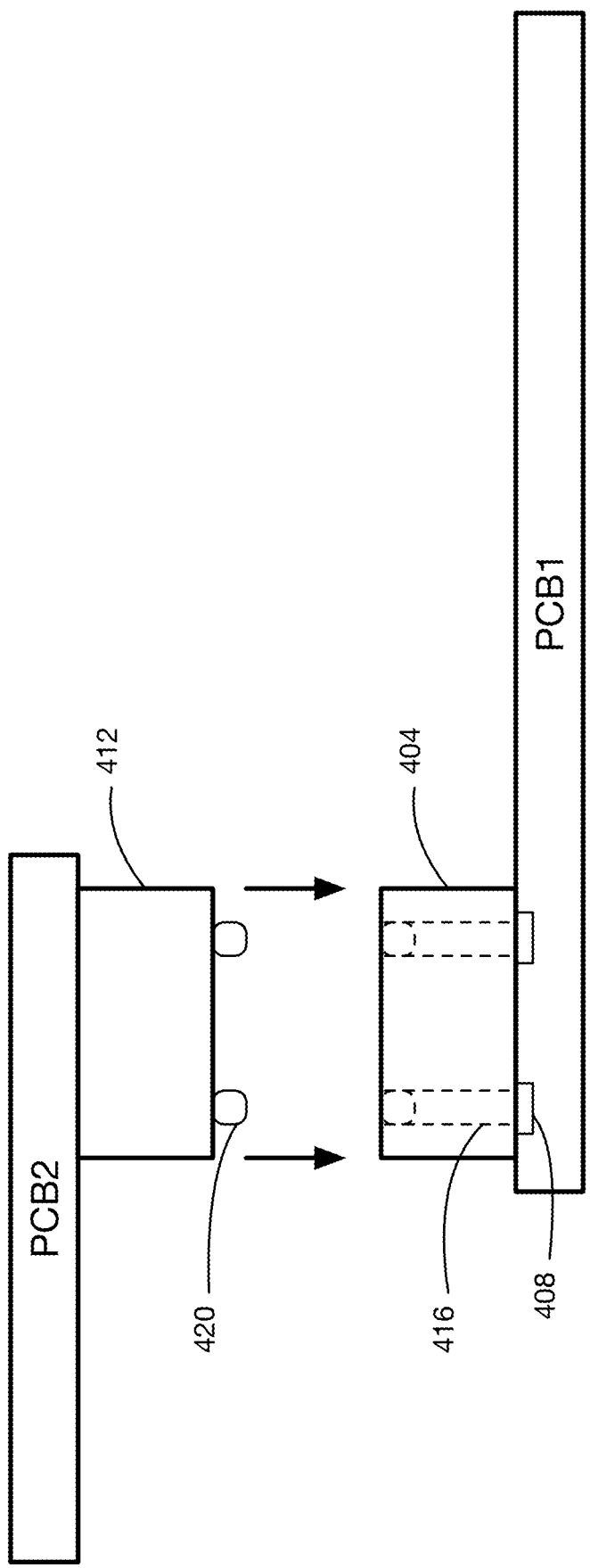

FIGS. 3A and 3B illustrate skew-tolerant four-wire channels having various lengths, in accordance with some embodiments. As shown, the four signal conductors as well as dielectric material 205 penetrate fully through dielectric material 105. FIG. 3B shows the length l of the channel being approximately equal to the width w, while FIG. 3A shows the length l being shorter than width w. In some embodiments, the l and w are on the order of millimeters. In such embodiments, the channel may be used as a connector between 2 printed circuit boards (PCBs), as shown in FIGS. 4A and 4B, and described below. In some embodiments, the above-described method may also be applied to a channel taking the form of a cable, in which case l>>w.

FIG. 4A illustrates an exemplary connection interface, in accordance with some embodiments. As shown, the skew-tolerant channel 404 is attached to PCB1, which may be a computer motherboard, without implying limitation. PCB2 (which may be a graphics processing unit or memory device, without implying limitation) is shown to have a connector 412 attached, including pins 420. In some embodiments, the pins 420 act as the signal conductors, and are inserted into holes 416, and make direct contact with PCB1's pads (or contacts) 408. In some embodiments, holes 416 may include conducting sleeves, which may be soldered to contacts 408, while the conducting sleeves maintain a connection to pins 420. FIG. 4B illustrates an alternative connection interface, in accordance with some embodiments. FIG. 4B is similar to FIG. 4A, except that skew-tolerant channel 404 includes conducting material in holes 416, and connector 412 on PCB2 includes short pins that make a direct contact to the conducting material in hole 416.

Figure 5:
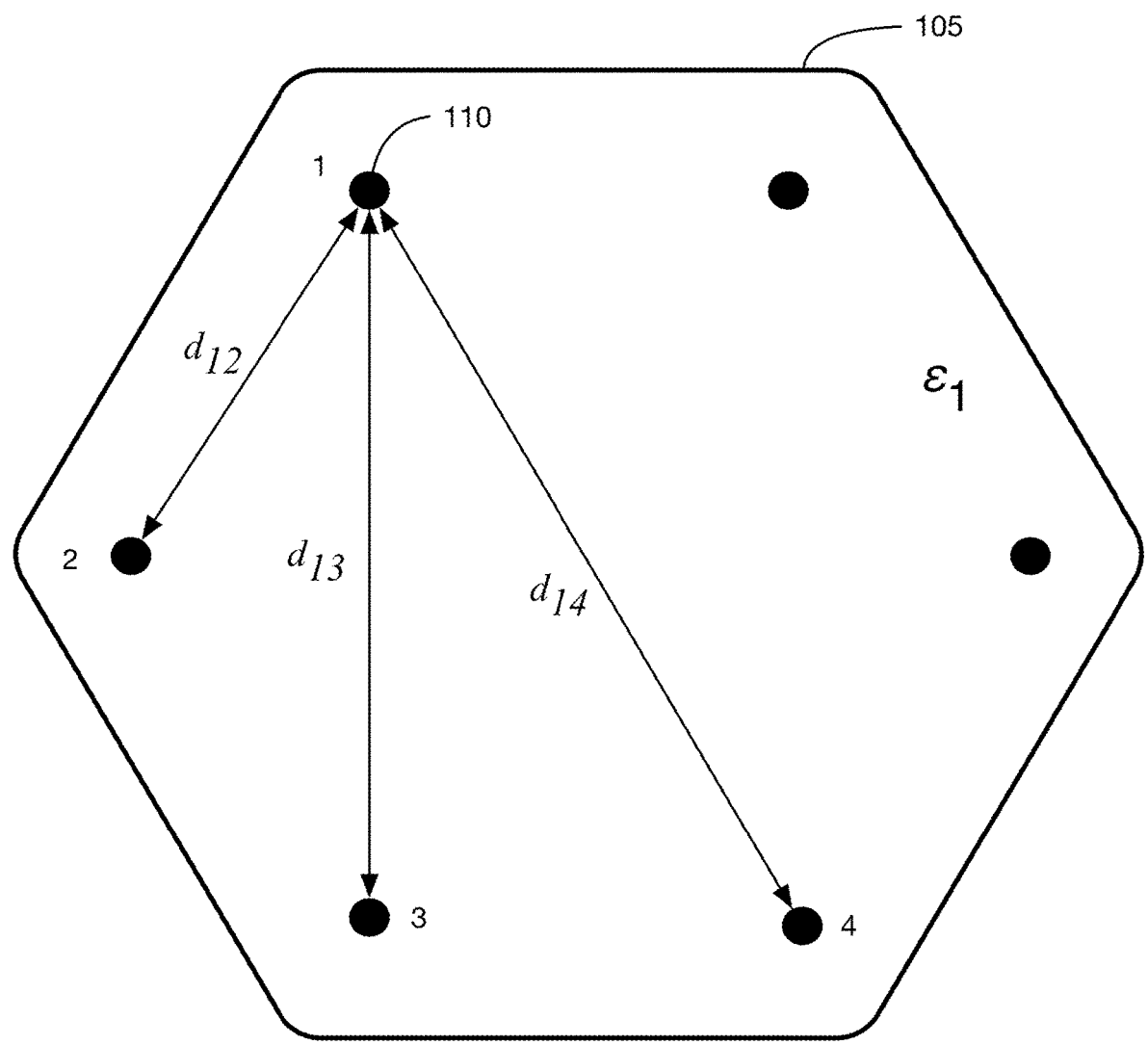
FIG. 5 illustrates an exemplary skew-resistant six-wire channel, in accordance with some embodiments.
Figure 6:
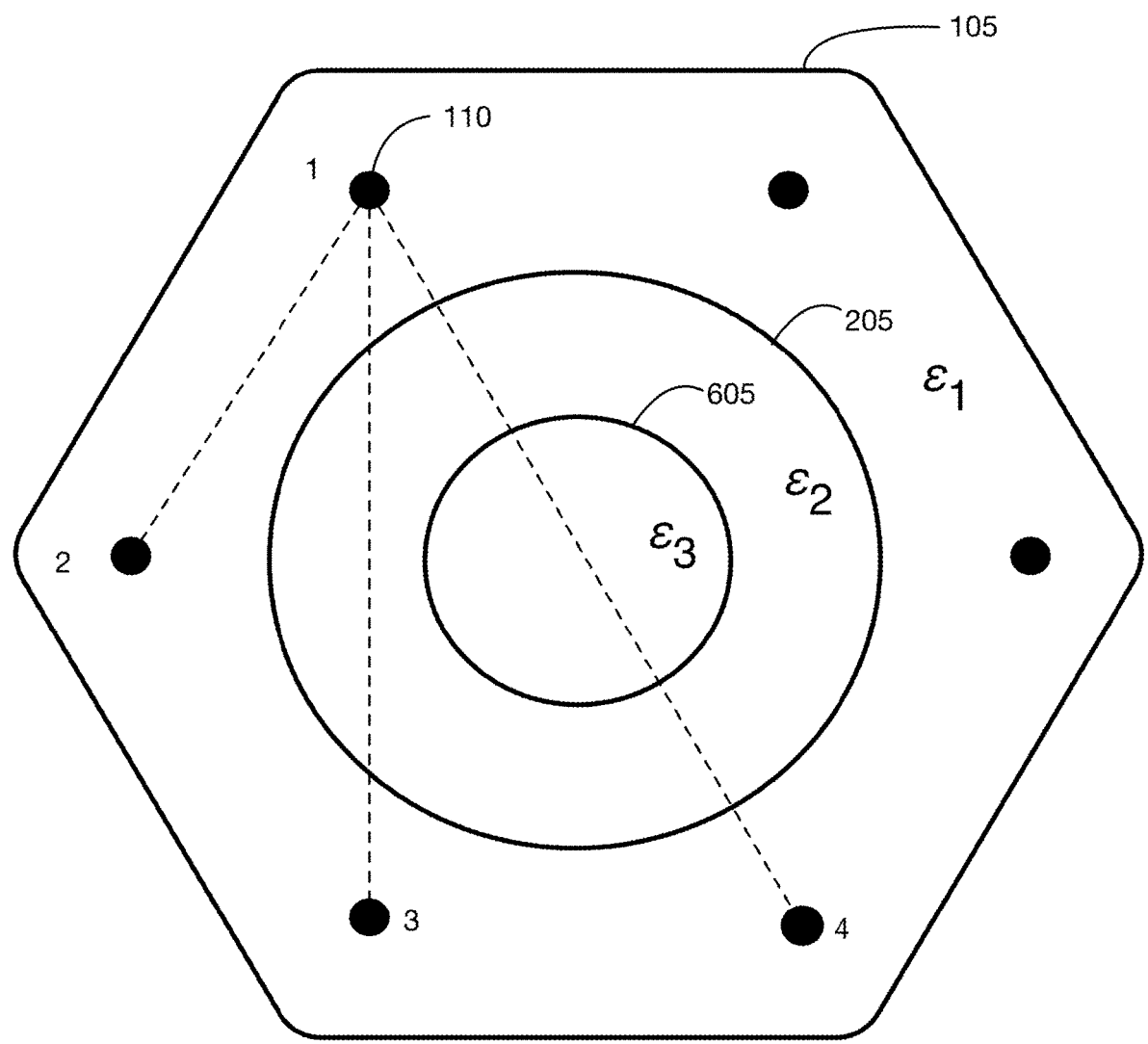
FIG. 6 illustrates the skew-resistant six-wire channel of FIG. 5 including first second and third dielectric materials, in accordance with some embodiments.

The above examples describe a simple case of a multi-wire skew-balanced channel, however such embodiments should not be considered limiting. FIG. 5 illustrates an exemplary six-wire channel. As shown in FIG. 5, there are three different distances: $d_{12} < d_{13} < d_{14}$. Using similar techniques described above, the signal propagation speed (or velocity factors) between conductors ½, ⅓, and ¼ may be matched by including additional dielectric materials. FIG. 6 illustrates a skew-tolerant six-wire channel, in accordance with some embodiments. As shown, FIG. 6 includes a first dielectric material 105 having dielectric constant $\varepsilon_1$, a second dielectric material 205 having dielectric constant $\varepsilon_2$, and a third dielectric material 605 having dielectric constant $\varepsilon_3$. Following the above procedures, it may be derived that $\varepsilon_3 > \varepsilon_2 > \varepsilon_1$. As shown in FIG. 6, the coupling between conductors 1 and 2 is affected by only the first dielectric material 105, the coupling between conductors 1 and 3 is affected by the first and second dielectric materials 105 and 205, respectively, while the coupling between conductors 1 and 4 is affected by the first, second and third dielectric materials 105, 205, and 605, respectively. Thus, each of the dielectric materials may be tuned to achieve equal mutual capacitance between any pair of wires, and to achieve equal VFs between each pair of conductors using techniques described above.

Figure 7A:
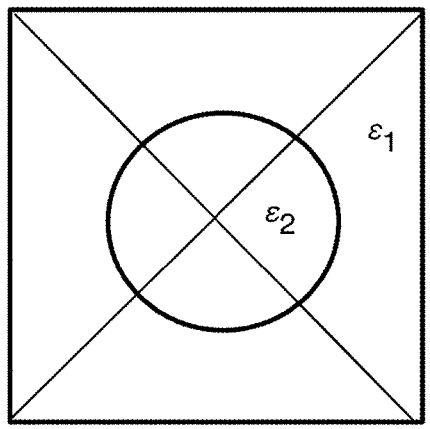
FIGS. 7A-7E depict various conductor arrangements, in accordance with some embodiments.
Figure 7B:
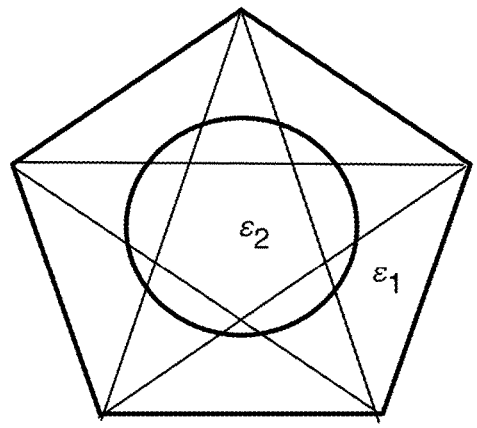
Figure 7C:
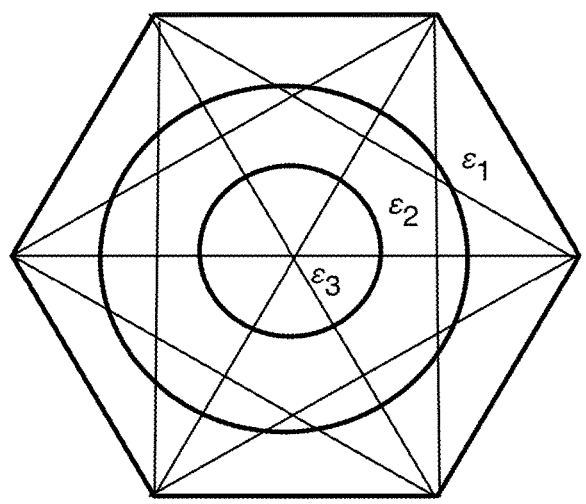
Figure 7D:
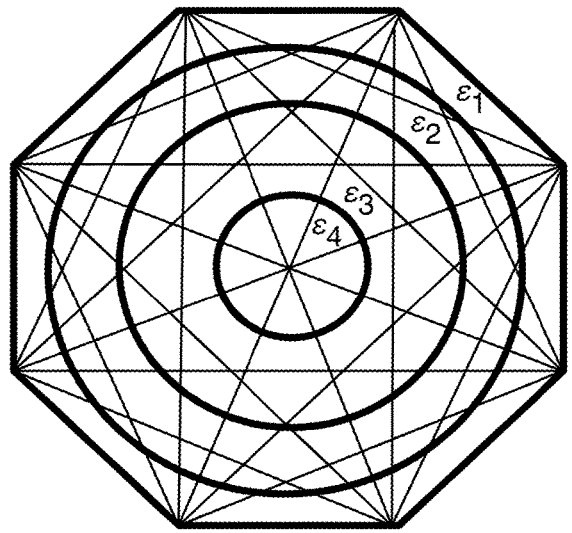
Figure 7E:
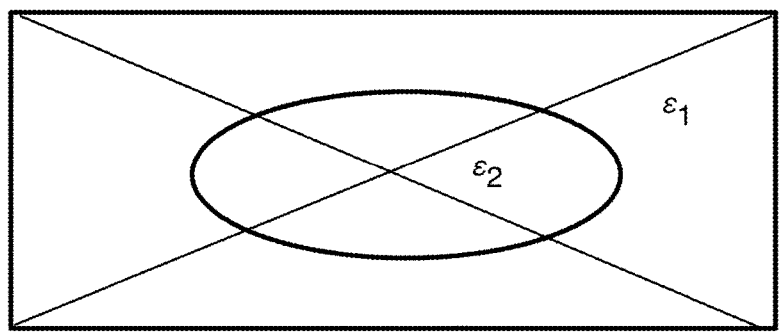

In some embodiments, for n wires arranged in a regular n-gon, a number of different distances k is equal to floor(n/2), where floor(x) is the largest integer<=x. In some embodiments, k concentric circles of dielectric materials having dielectric constant $\varepsilon_m$ may be inserted into the n-gon such that the direct line between a vertex v and a vertex w passes through the k-th inter circle if the distance between v and w is the (k+1)-th smallest distance, where k is an integer 0<k<floor(n/2)−1, and does not pass through the (k+1)-th inner circle. FIGS. 7A-7D depicts various n-gons including a square (n=4), a pentagon (n=5), a hexagon (n=6) and an octagon (n=8), respectively. It should also be noted that embodiments described above have points representing vertices on a circle, however in alternative embodiments, this may not be the case. In such embodiments, the shape of the dielectrics may be adjusted, as shown in FIG. 7E, where the conductors are vertices on a rectangle. Other possible shapes the conductors may be arranged in may include trapezoids, ovals, and triangles, as well as any other shapes known to those of skill in the art.

In some embodiments, a skew-balanced bus as described above may be equipped with (or connected to) a transceiver configured to encode received information signals into codewords of a vector signaling code. In some embodiments, the transceiver may be adapted to receive information bits from a first type of interface (USB-C) or similar interfaces having a prior art signaling scheme, such as non-return to zero (NRZ), and may convert the received information bits to multi-level vector signaling codewords for transmission. Further, a cable incorporating a skew-balanced bus as described above may include a single transceiver at one end of the cable, or alternatively at each end of the cable may include a transceiver.

Figure 8:
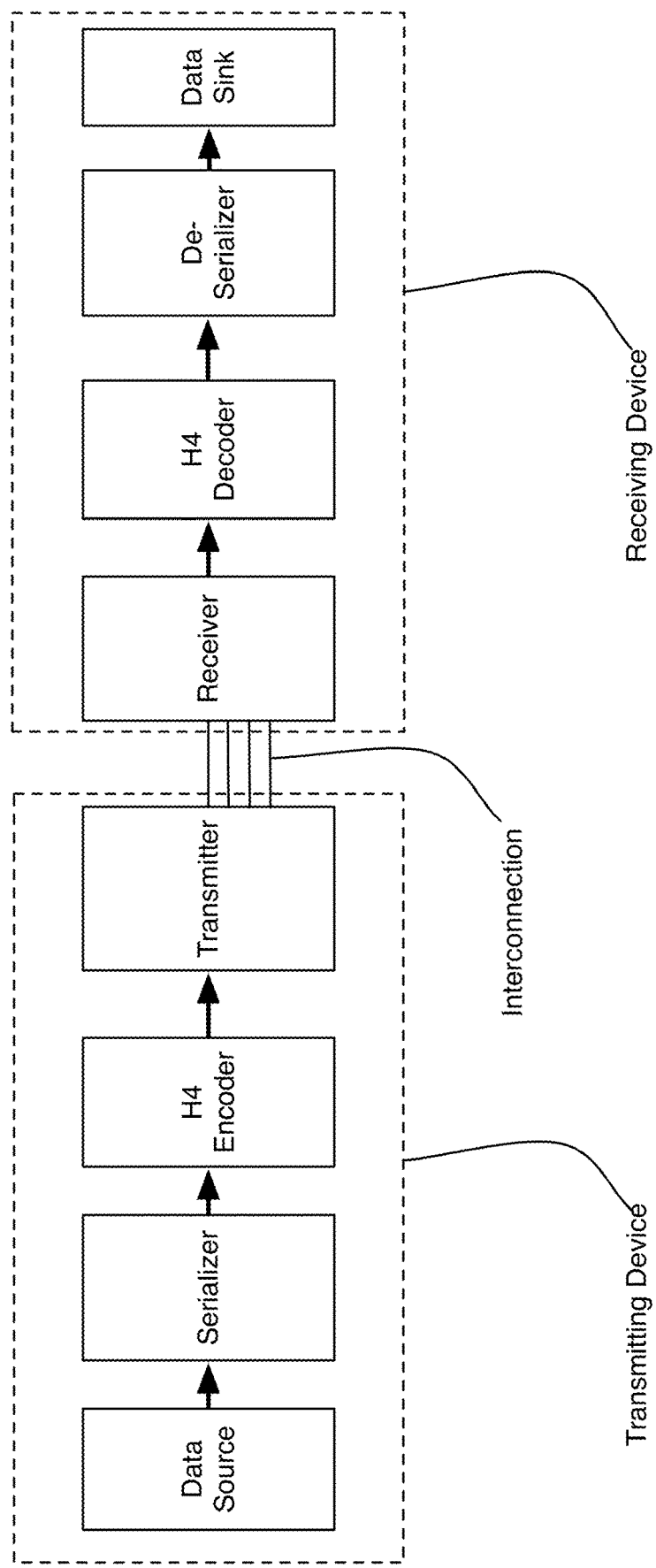
FIG. 8 is a block diagram of a system comprised of a Transmitting Device, Interconnection, and Receiving Device.

FIG. 8 is a block diagram of a system comprised of a transmitting device, interconnection, and receiving device. The data source may be a host computing device, or an adapter or transceiver supporting another interface type. The data sink may also be a host computing device, or an adapter or transceiver supporting another interface type. As a non-limiting example, FIG. 8 shows the Data Source co-located with the transmitter within the transmitting device, and the data sink co-located with the receiver within the receiving device.

Figure 9:
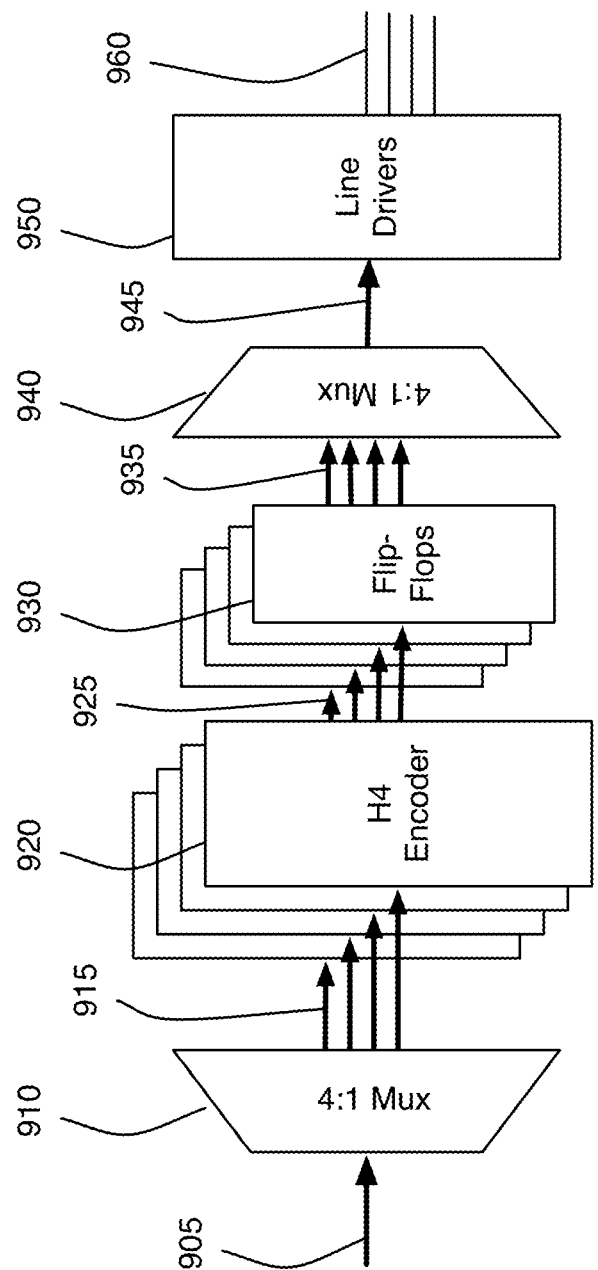
FIG. 9 illustrates one embodiment of a Transmitting Device utilizing multiple processing phases for H4 encoding.

FIG. 9 illustrates one embodiment of a transmitting device utilizing multiple processing phases for H4 (also referred to as ENRZ) encoding. As described by [Fox I], the H4 vector signaling code encodes three data bits for transmission over four wires. At very high communication rates, multiple instances of such encoders may execute essentially in parallel as distinct processing phases of a multi-phase encoder. At lower data rates, a single processing instance may suffice. In some embodiments, a skew-balanced multi-wire bus may include a transceiver having the components or a subset of the components of the transmitting device of FIG. 9.

Figure 10A:
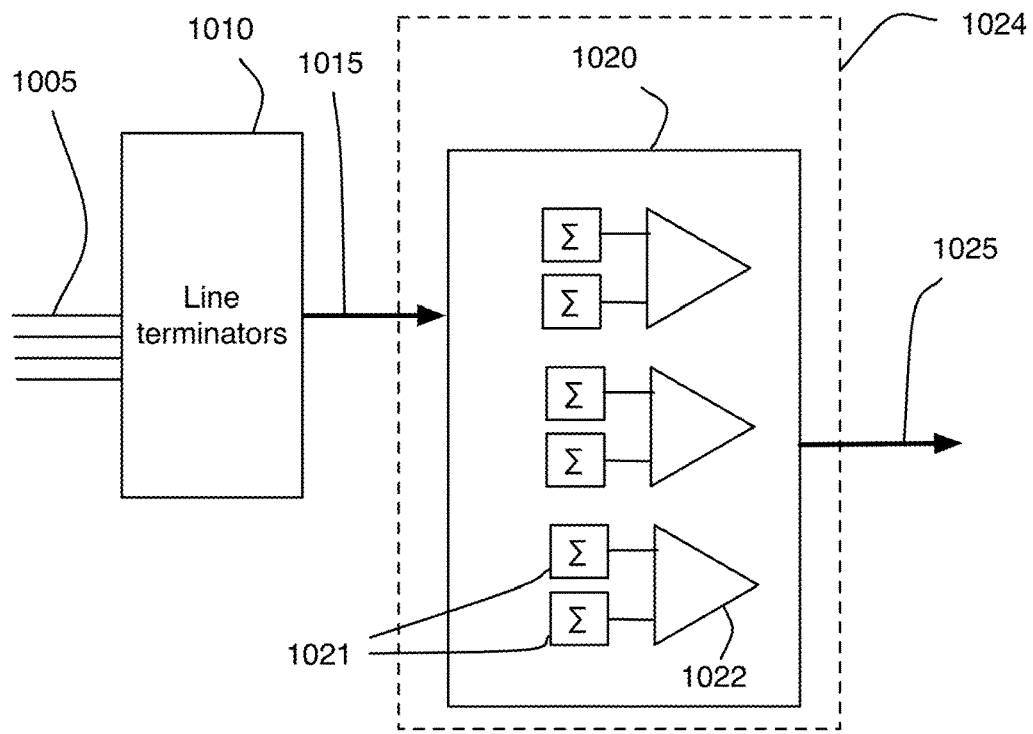
FIG. 10A illustrates one embodiment of a receiving device, with FIG. 10B showing additional details of that embodiment's use of multiple processing phases for H4 decoding.
Figure 10B:
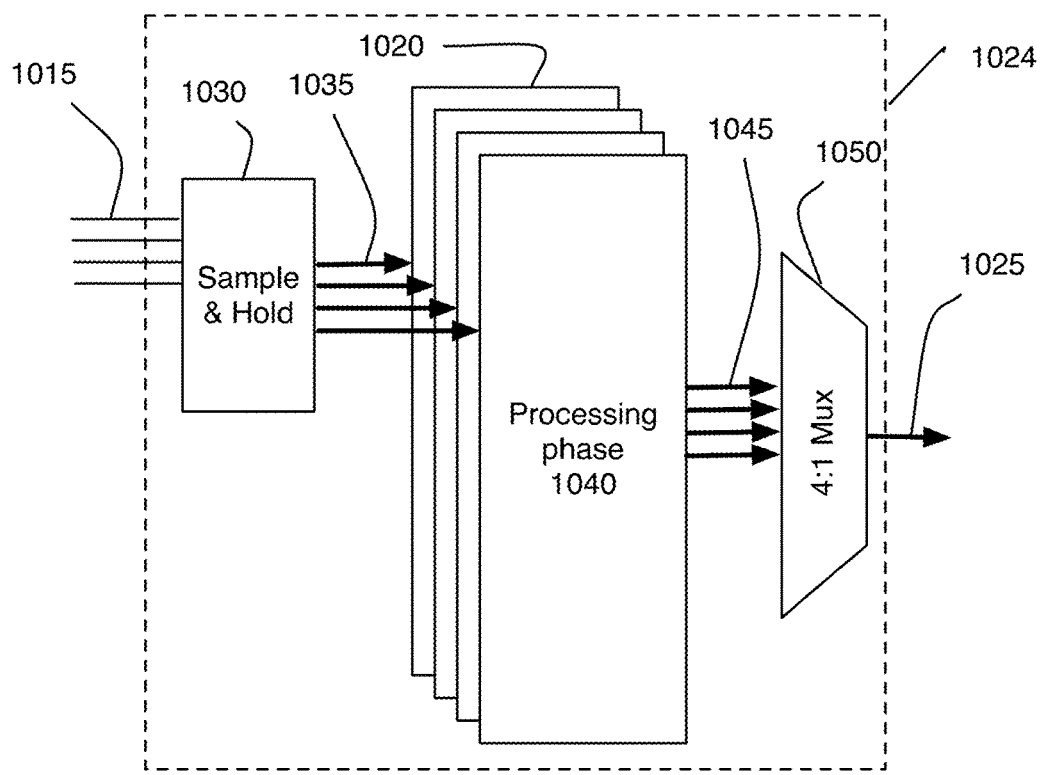

FIG. 10A illustrates one embodiment of a receiving device. [Fox I] also describes use of multi-input comparators (MIC) as vector signaling code decoders. Each H4 decoding MIC is comprised of two summation elements 1021, and one difference or comparison element 1022. Three MICs are sufficient 1020 to fully decode the three received bits 1025 of the H4 code. As with the previously described transmitter, multiple processing phases may be applied to the receiver to support very high communication rates. FIG. 10B shows additional details of an embodiment utilizing multiple processing phases 1020 for H4 decoding. Lower communication rates may be supported by fewer, or a single processing phase. In some embodiments, a skew-balanced multi-wire bus may include a transceiver having the components or a subset of the components of the receiving device of FIG. 9.

Figure 11:
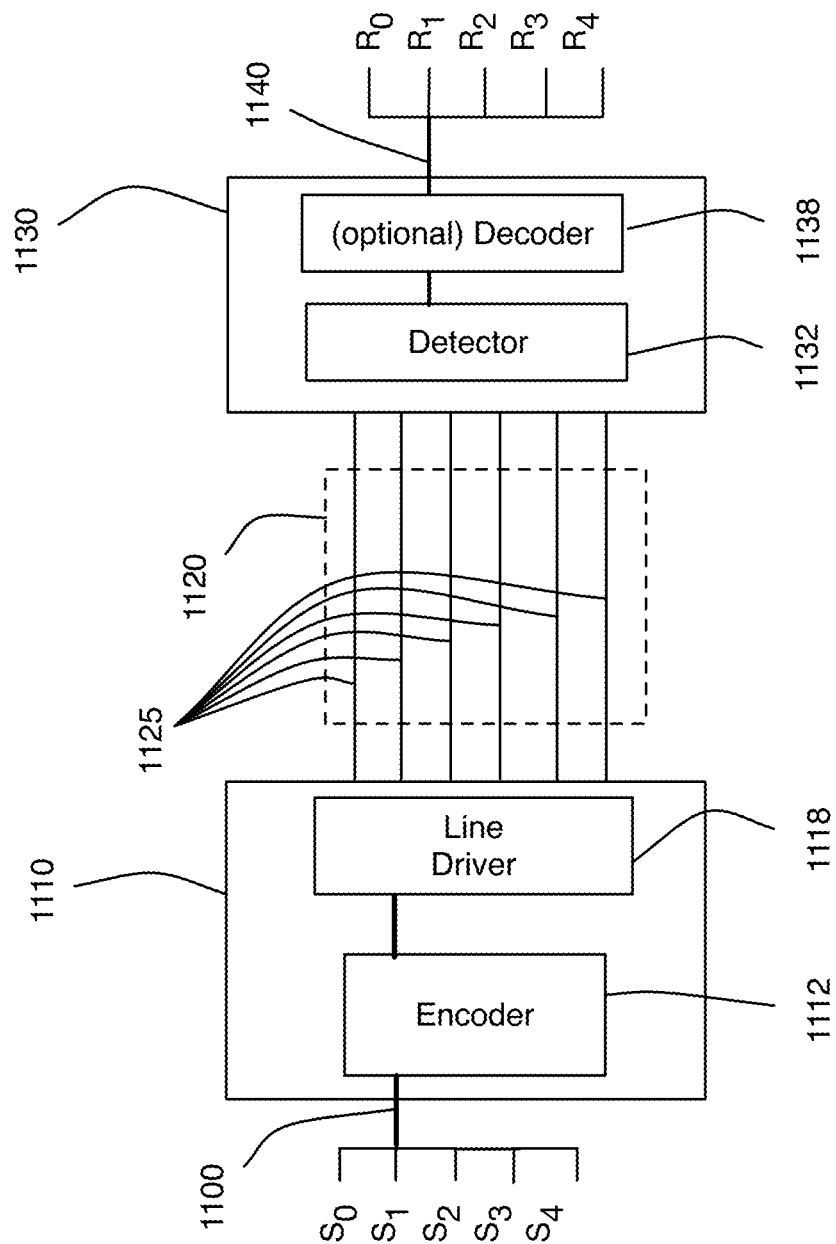
FIG. 11 is a block diagram of a system utilizing the CNRZ-5 code for communication between transmitter 1110 and receiver 1130 via multiple wires 1125.

CNRZ-5 is another vector signaling code designed to communicate five bits over six wires, as described by [Hormati I]. FIG. 11 is a block diagram of a system utilizing the CNRZ-5 code for communication between transmitter 1110 and receiver 1130 via multiple wires. As in FIG. 8, data source $S_0$-$S_4$ and data sink $R_0$-$R_4$ may be host computing devices, or adapters or transceivers supporting another interface type. In some embodiments, transmitters may be co-located with data sources, and receivers may be are co-located with data sinks.

Figure 12:
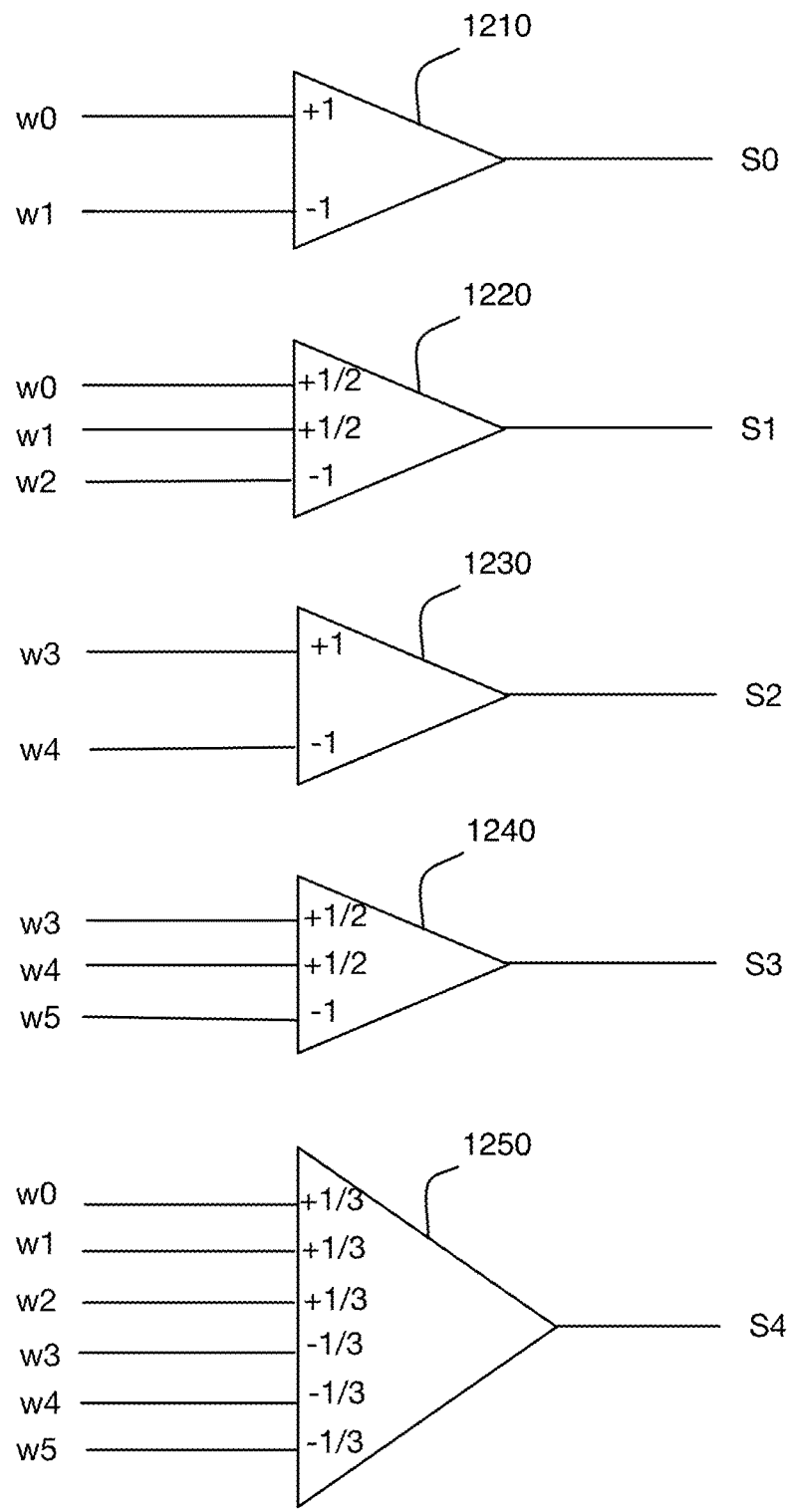
FIG. 12 shows one embodiment of a CNRZ-5 receiver, in which received signals S0-S4 are decoded directly from received wire signals w0-w5 using weighted multi-input comparators.

FIG. 12 shows one embodiment of a CNRZ-5 receiver, in which received signals S0-S4 are decoded directly from received wire signals w0-w5 using weighted multi-input comparators. As described by [Hormati I] five weighted input multi-input comparators fully decode a CNRZ-5 vector signaling code.

Figure 13:
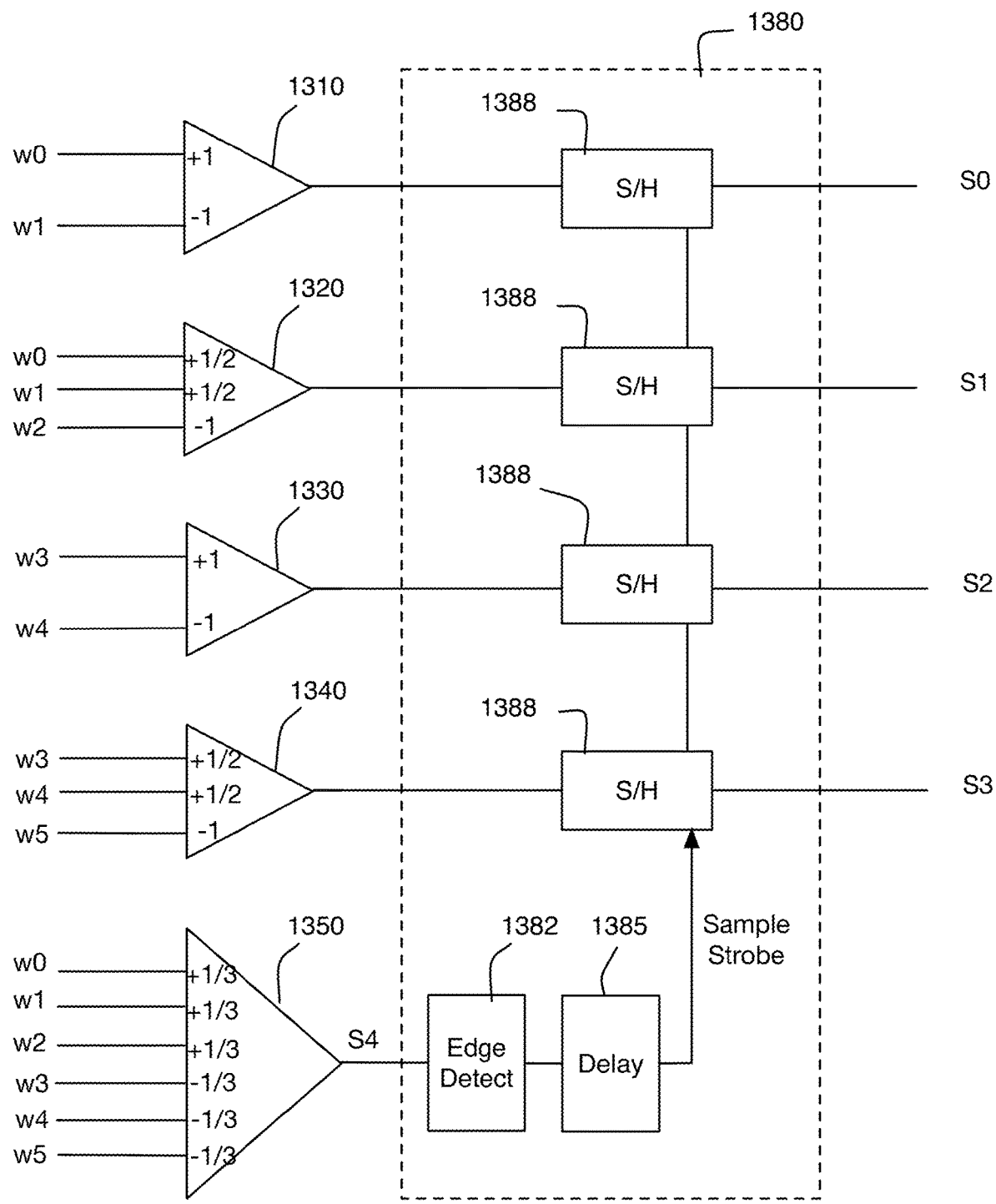
FIG. 13 shows another embodiment of a CNRZ-5 receiver, in which received signals S0-S4 are decoded directly from received wire signals w0-w5 using weighted multi-input comparators, and data signals S0-S3 are then latched by a strobe signal communicated via signal S4.

FIG. 13 shows another embodiment of a CNRZ-5 receiver, in which received signals S0-S4 are decoded directly from received wire signals w0-w5 using weighted multi-input comparators, and data signals S0-S3 are then latched by a strobe signal communicated via signal S4.

Figure 14:
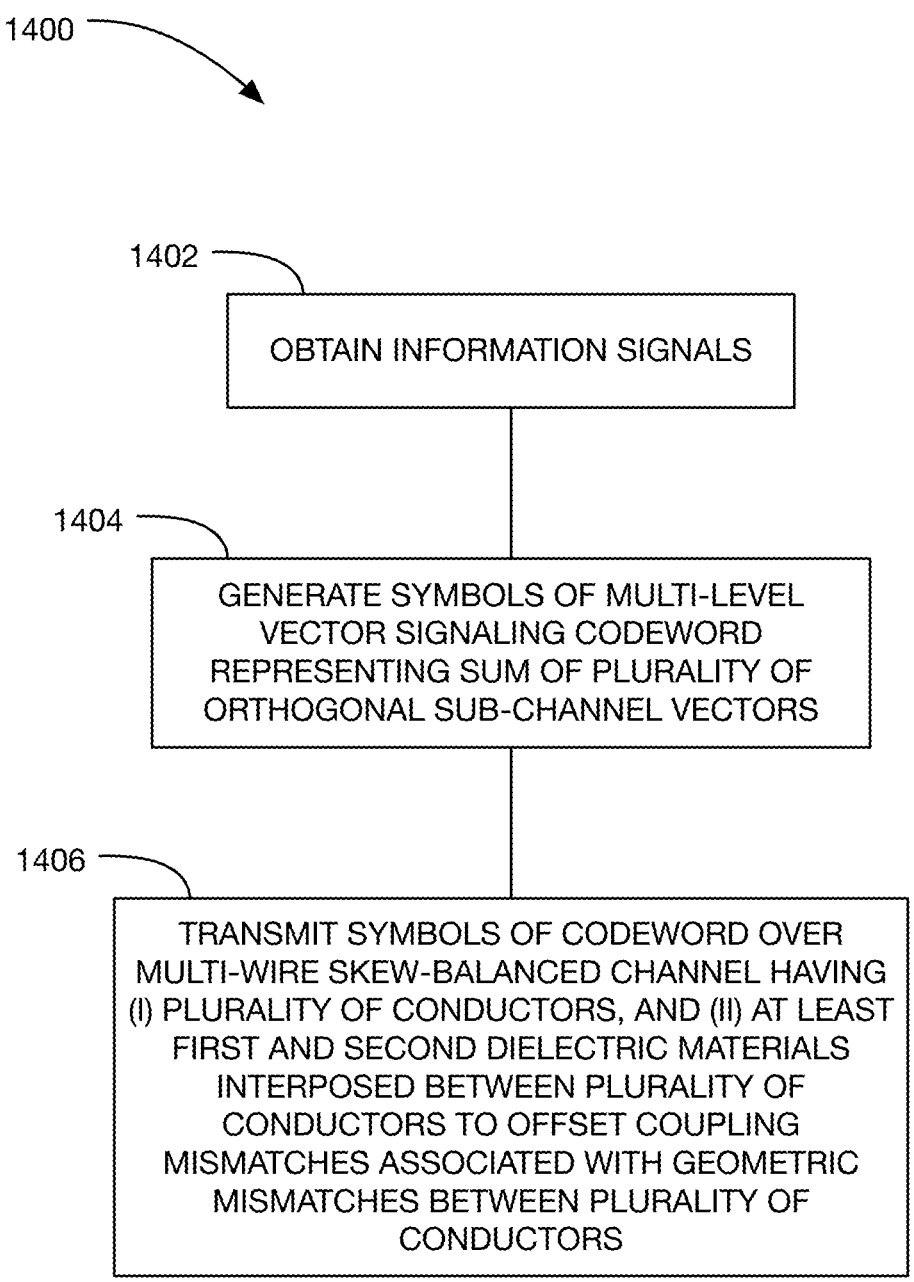
FIG. 14 illustrates a flowchart of a method, in accordance with some embodiments.

FIG. 14 is a flowchart of a method 1400, in accordance with some embodiments. As shown, method 1400 includes obtaining 1402 a set of information signals and responsively generating 1404 symbols of a multi-level vector signaling codeword, the multi-level vector signaling codeword representing a sum of a plurality of orthogonal sub-channel vectors, each sub-channel vector having an associated weight determined by a corresponding information signal. At 1406, the symbols of the codeword are transmitted over a multi-wire skew-balanced channel, the multi-wire skew-balanced channel having (i) a plurality of conductors, each conductor for carrying a respective symbol of the multi-level vector signaling codeword and (ii) at least first and second dielectric materials interposed between the plurality conductors to offset coupling mismatches associated with geometric mismatches between the plurality of conductors.

The examples presented herein illustrate the use of vector signaling codes for point-to-point wire communications. For purposes of explanation, interconnection between a first transmitting device and a second receiving device have been described as unidirectional signaling networks. However, this should not been seen in any way as limiting the scope of the described invention. The methods disclosed in this application are equally applicable to networks capable of alternating signaling direction (i.e. half duplex), or of providing simultaneous communication between separate transmitters and receivers in both directions (i.e. full duplex.) Similarly, more than one instance of the described invention may be used essentially in parallel to communicate wider data words and/or provide higher overall communication bandwidth, with individual instances having individual embedded clocks, or two or more instances sharing a common clock. Other communication media including optical and wireless communications may similarly be used rather than the described wire interconnections. Thus, descriptive terms herein such as "voltage" or "signal level" should be considered to include equivalents in other measurement systems, such as "optical intensity", "RF modulation", etc. As used herein, the term "physical signal" includes any suitable behavior and/or attribute of a physical phenomenon capable of conveying information. Physical signals may be tangible and non-transitory.

We claim:

1. A method comprising:
    obtaining a set of information signals and responsively generating symbols of a multi-level vector signaling codeword, the multi-level vector signaling codeword representing a sum of a plurality of orthogonal sub-channel vectors, each sub-channel vector having an associated weight determined by a corresponding information signal; and
    transmitting the symbols of the codeword over a multi-wire skew-balanced channel, the multi-wire skew-balanced channel having (i) a plurality of conductors, each conductor for carrying a respective symbol of the multi-level vector signaling codeword and (ii) at least first and second dielectric materials interposed between the plurality conductors to offset coupling mismatches associated with geometric mismatches between the plurality of conductors.

2. The method of claim 1, wherein the geometric mismatches comprise at least two pairs of conductors being separated by different distances.

3. The method of claim 1, wherein the geometric mismatches comprise at least two conductors having different thicknesses.

4. The method of claim 1, wherein the multi-level vector signaling codeword is balanced.

5. The method of claim 1, wherein the multi-wire skew-balanced channel has a length l and a width w.

6. The method of claim 5, wherein l$\gg$w.

7. The method of claim 5, wherein l$\approx$w.

8. The method of claim 1, wherein the dielectric materials are arranged in a concentric circle pattern.

9. The method of claim 1, wherein first dielectric material is disposed between a first pair of conductors of the plurality of conductors, and wherein the second dielectric material is disposed between the first pair of conductors and a second pair of conductors of the plurality of conductors.

10. The method of claim 9, wherein the first dielectric material has a higher dielectric constant than the second dielectric material.

11. An apparatus comprising:
    an encoder configured to obtain a set of information signals and to responsively generate symbols of a multi-level vector signaling codeword, the multi-level vector signaling codeword representing a sum of a plurality of orthogonal sub-channel vectors, each sub-channel vector having an associated weight determined by a corresponding information signal;
    a multi-wire skew-balanced channel having (i) a plurality of conductors, each conductor for carrying a respective symbol of the multi-level vector signaling codeword and (ii) at least first and second dielectric materials interposed between the plurality conductors to offset coupling mismatches associated with geometric mismatches between the plurality of conductors; and
    a plurality of drivers configured to transmit the symbols of the codeword over the plurality of conductors of the multi-wire skew-balanced channel.

12. The apparatus of claim 11, wherein the geometric mismatches correspond to at least two pairs of conductors being separated by different distances.

13. The apparatus of claim 11, wherein the geometric mismatches correspond to at least two conductors having a different thickness.

14. The apparatus of claim 11, wherein the multi-level vector signaling codeword is balanced.

15. The apparatus of claim 11, wherein the multi-wire skew-balanced channel has a length l and a width w.

16. The apparatus of claim 15, wherein l$\gg$w.

17. The apparatus of claim 15, wherein l$\approx$w.

18. The apparatus of claim 11, wherein the dielectric materials are arranged in a concentric circle pattern.

19. The apparatus of claim 11, wherein the first dielectric material is disposed between a first pair of conductors of the plurality of conductors, and wherein the second dielectric material is disposed between the first pair of conductors and a second pair of conductors of the plurality of conductors.

20. The apparatus of claim 19, wherein the first dielectric material has a higher dielectric constant than the second dielectric material.

* * * * *